United States Patent
Chuang

(10) Patent No.: US 12,238,869 B2
(45) Date of Patent: Feb. 25, 2025

(54) CHIP PIN CONNECTION STATUS DISPLAY METHOD, COMPUTER DEVICE AND STORAGE MEDIUM

(71) Applicant: HON HAI PRECISION INDUSTRY CO., LTD., New Taipei (TW)

(72) Inventor: Hsin-Hua Chuang, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 898 days.

(21) Appl. No.: 17/372,727

(22) Filed: Jul. 12, 2021

(65) Prior Publication Data

US 2022/0013051 A1    Jan. 13, 2022

(30) Foreign Application Priority Data

Jul. 13, 2020   (CN) .......................... 202010671322.4

(51) Int. Cl.
*H05K 13/08*   (2006.01)
*G06F 3/047*   (2006.01)

(52) U.S. Cl.
CPC ......... *H05K 13/0817* (2018.08); *G06F 3/047* (2013.01)

(58) Field of Classification Search
CPC ............................ H05K 13/0817; G06F 3/047
See application file for complete search history.

(56) References Cited

FOREIGN PATENT DOCUMENTS

| CN | 102778647 |   | 11/2012 |
|----|-----------|---|---------|
| CN | 110674069 A | * | 1/2020 |
| CN | 110674077 |   | 1/2020 |

* cited by examiner

*Primary Examiner* — Minh Q Phan
(74) *Attorney, Agent, or Firm* — ScienBiziP, P.C.

(57) ABSTRACT

A chip pin connection status display method applied to a computer device is provided. The method includes generating a two-dimensional matrix with n rows and m columns according to a total number n of solder balls and a total number m of pins of a chip. Once an input signal and an input position of the input signal from the two-dimensional matrix are detected, display is performed at the input position on the two-dimensional matrix according to a type of the input signal and the input position of the input signal.

20 Claims, 7 Drawing Sheets

CHIP PIN CONNECTION STATUS DISPLAY METHOD, COMPUTER DEVICE AND STORAGE MEDIUM

FIELD

The present disclosure relates to chip manufacturing technology field, in particular to a chip pin connection status display method, a computer device and a storage medium.

BACKGROUND

Generally, a chip may include hundreds or thousands of pins. Correspondingly, an operator needs to confirm a connection relationship between each of the hundreds or thousands of pins and one or more solder balls. During a process of manufacturing the chip, the operator needs to spend a lot of time to confirm the connection relationship between the pins and the solder balls.

DETAILED DESCRIPTION

In order to provide a more clear understanding of the objects, features, and advantages of the present disclosure, the same are given with reference to the drawings and specific embodiments. It should be noted that the embodiments in the present disclosure and the features in the embodiments may be combined with each other without conflict.

In the following description, numerous specific details are set forth in order to provide a full understanding of the present disclosure. The present disclosure may be practiced otherwise than as described herein. The following specific embodiments are not to limit the scope of the present disclosure.

Unless defined otherwise, all technical and scientific terms herein have the same meaning as used in the field of the art technology as generally understood. The terms used in the present disclosure are for the purposes of describing particular embodiments and are not intended to limit the present disclosure.

Figure 1:
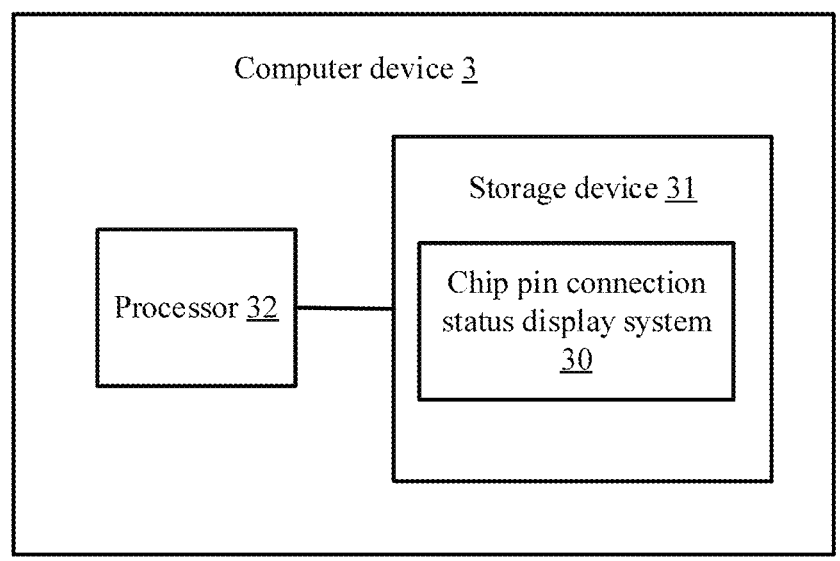
FIG. 1 is a structural diagram of a computer device according to a preferred embodiment of the present disclosure.

FIG. 1 illustrates a schematic diagram of a computer device of the present disclosure.

In at least one embodiment, the computer device 3 includes a storage device 31, at least one processor 32. The storage device 31 and the at least one processor 32 are in electrical communication with each other.

Those skilled in the art should understand that the structure of the computer device 3 shown in FIG. 1 does not constitute a limitation of the embodiment of the present disclosure. Other examples of a computer device 3 can further include more or less other hardware or software than that shown in FIG. 1, or the computer device 3 can have different component arrangements.

It should be noted that the computer device 3 is merely an example. If another kind of computer device can be adapted to the present disclosure, it should also be included in the protection scope of the present disclosure, and incorporated herein by reference In some embodiments, the storage device 31 may be used to store program codes and various data of computer programs. For example, the storage device 31 may be used to store a chip pin connection status display system 30 installed in the computer device 3 and implement completion of storing programs or data during an operation of the computer device 3. The storage device 31 may include Read-Only Memory (ROM), Programmable Read-Only Memory (PROM), and Erasable Programmable Read-Only Memory. EPROM), One-time Programmable Read-Only Memory (OTPROM), Electronically-Erasable Programmable Read-Only Memory (EEPROM), Compact Disc (Compact Disc) Read-Only Memory (CD-ROM) or other optical disk storage, disk storage, magnetic tape storage, or any other non-transitory computer-readable storage medium that can be used to carry or store data.

In some embodiments, the at least one processor 32 may be composed of an integrated circuit. For example, the at least one processor 32 can be composed of a single packaged integrated circuit or can be composed of multiple packaged integrated circuits with the same function or different function. The at least one processor 32 includes one or more central processing units (CPUs), one or more microprocessors, one or more digital processing chips, one or more graphics processors, and various control chips. The at least one processor 32 is a control unit of the computer device 3. The at least one processor 32 uses various interfaces and lines to connect various components of the computer device 3, and executes programs or modules or instructions stored in the storage device 31, and invokes data stored in the storage device 31 to perform various functions of the computer device 3 and to process data, for example, a function of displaying the connection status of chip pins (namely pins of the chip). For details, see the description of FIG. 3.

In this embodiment, the chip pin connection status display system 30 can include one or more modules. The one or more modules are stored in the storage device 31 and are executed by at least one processor (e.g. processor 32 in this embodiment), such that a function of displaying the connection status of chip pins (for details, see the introduction to FIG. 3 below) is achieved.

Figure 2:
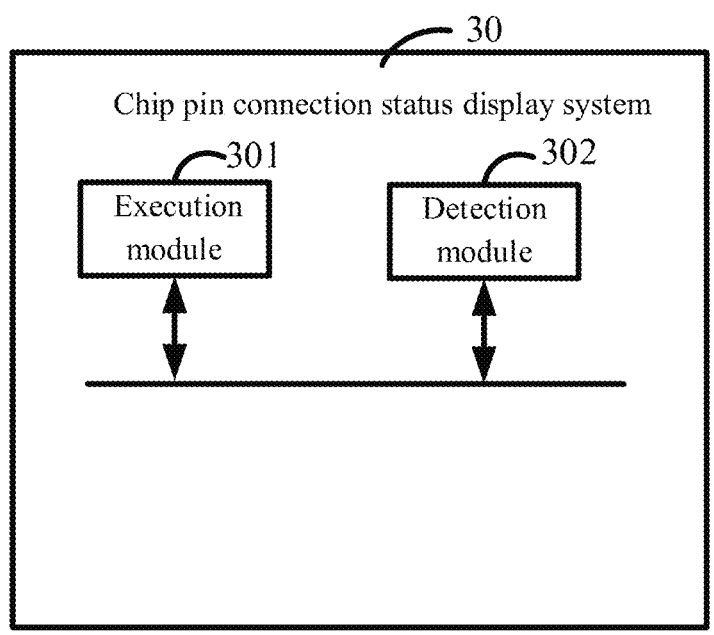
FIG. 2 shows one embodiment of modules of a chip pin connection status display system of the preferred embodiment of the present disclosure.

In this embodiment, the chip pin connection status display system 30 can include a plurality of modules. Referring to FIG. 2, the plurality of modules includes an execution module 301, and a detection module 302. The module referred to in the present disclosure refers to a series of computer-readable instructions that can be executed by at least one processor (for example, the processor 32), and can complete functions, and can be stored in a storage device (for example, the storage device 31 of the computer device 3). In this embodiment, functions of each module will be described in detail with reference to FIG. 3.

Figure 3:
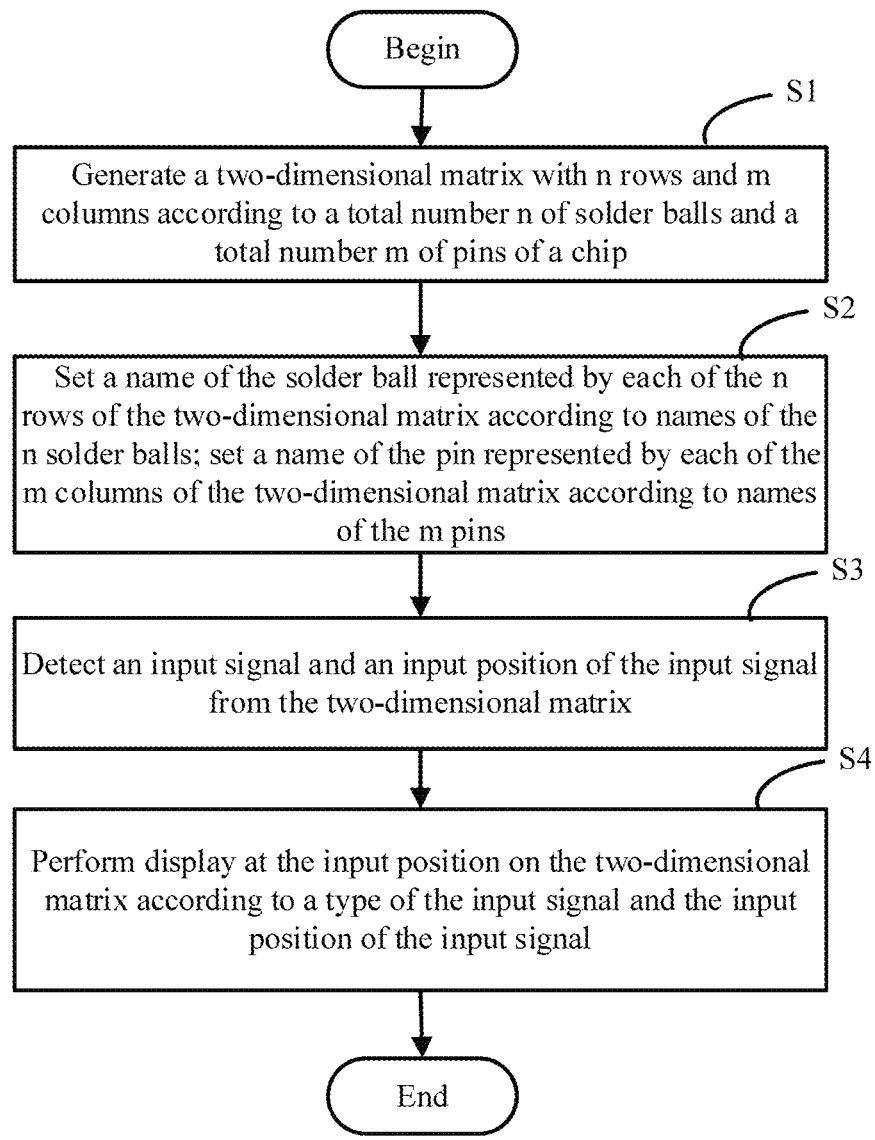
FIG. 3 is a flowchart of a chip pin connection status display method according to a preferred embodiment of the present disclosure.

In this embodiment, an integrated unit implemented in a form of a software module can be stored in a non-transitory readable storage medium. The above modules include one or more computer-readable instructions. The computer device 3 or a processor implements the one or more computer-readable instructions, such that the method for displaying the connection status of the chip pins shown in FIG. 3 is achieved.

In a further embodiment, referring to FIG. 2, the at least one processor 32 can execute an operating system of the computer device 3, various types of applications (such as the chip pin connection status display system 30 described above), program codes, and the like.

In a further embodiment, the storage device 31 stores program codes of a computer program, and the at least one processor 32 can invoke the program codes stored in the storage device 31 to achieve related functions. For example, each module of the chip pin connection status display system 30 shown in FIG. 2 is program code stored in the storage device 31. Each module of the chip pin connection status display system 30 shown in FIG. 2 is executed by the at least one processor 32, such that the functions of the modules are achieved, and the purpose of displaying the connection status of chip pins (see the description of FIG. 3 below for details) is achieved.

In one embodiment of the present disclosure, the storage device 31 stores one or more computer-readable instructions, and the one or more computer-readable instructions are executed by the at least one processor 32 to achieve a purpose of displaying the connection status of chip pins. Specifically, the computer-readable instructions executed by the at least one processor 32 to achieve the purpose of displaying the connection status of chip pins is described in detail in FIG. 3 below.

It should be noted that, in other embodiments, the chip pin connection status display system 30 may also be implemented as an embedded system with a storage device, a processor, and other necessary hardware or software.

FIG. 3 is a flowchart of a chip pin connection status display method according to a preferred embodiment of the present disclosure.

In this embodiment, the chip pin connection status display method can be applied to the computer device 3. For the computer device 3 that requires displaying the connection status of chip pins, the computer device 3 can be directly integrated with the function of displaying the connection status of chip pins. The computer device 3 can also achieve the function of displaying the connection status of chip pins by running a Software Development Kit (SDK).

FIG. 3 shows a flow chart of one embodiment of the method for displaying the connection status of the chip pins. Referring to FIG. 3, the method is provided by way of example, as there are a variety of ways to carry out the method. The method described below can be carried out using the configurations illustrated in FIG. 1, for example, and various elements of these figures are referenced in explanation of method. Each block shown in FIG. 3 represents one or more processes, methods, or subroutines, carded out in the method. Furthermore, the illustrated order of blocks is illustrative only and the order of the blocks can be changed. Additional blocks can be added or fewer blocks can be utilized without departing from this disclosure. The example method can begin at block S1.

At block S1, the execution module 301 generates a two-dimensional matrix with n rows and in columns according to a total number n of solder balls and a total number m of pins of a chip. Each of the n rows of the two-dimensional matrix represents one of the n solder balls, and each of the m columns of the two-dimensional matrix represents one of the m pins.

The n solder balls are used to connect with the m pins of the chip. The n and m are positive integers.

In one embodiment, the execution module 301 first determines a value of the n and a value of m before generating the two-dimensional matrix.

In one embodiment, the execution module 301 can determine the value of then (i.e., the total number n of solder balls) and a name of each of then solder balls in response to user input. That is, the execution module 301 determines the value of n and the names corresponding to the n solder balls according to the user input.

In other embodiments, the execution module 301 may read a specified document, and obtain the value of n and the names of the n solder balls from the specified document. The specified document may be a TXT file, which records the name of each of then solder balls.

In an embodiment, the execution module 301 can obtain the value of m and a name of each of the m pins from an IBIS (Input/Output Buffer Information Specification) model. The IBIS model records all pins of the chip and the name of each pin.

In other embodiments, when there are multiple IBIS models, the execution module 301 generates multiple two-dimensional matrices correspondingly, and each of the multiple two-dimensional matrices respectively corresponds to one of the multiple IBIS models.

It should be noted that each IBIS model of the multiple IBIS models corresponds to a chip, and the chips respectively corresponding to the multiple IBIS models need to be integrated into a same package. For example, a chip corresponding to one of the multiple MIS models is a WIFI chip, and a chip corresponding to another one of the multiple IBIS models is a Bluetooth chip. The pins of the chip corresponding to each of the multiple IBIS models need to be connected to n solder balls respectively, and the number of pins of the chip corresponding to each IBIS model of the multiple IBIS models is the same. Therefore, the number of rows included in each two-dimensional matrix of the multiple two-dimensional matrices is the same, that is, the value of n is the same; the number of columns included in each two-dimensional matrix of the multiple two-dimensional matrices is the same, that is the value of m is the same.

In an embodiment, the execution module 301 may display the multiple two-dimensional matrices in pages. For example, the execution module 301 displays each of the multiple two-dimensional matrices in each page.

At block S2, the execution module 301 sets the name of the solder ball represented by each of the n rows of the two-dimensional matrix according to the names of the n solder balls. The execution module 301 sets the name of the pin represented by each of the m columns of the two-dimensional matrix according to the names of the m pins.

In an embodiment, the execution module 301 may randomly assign the names of the n solder balls to the n rows of the two-dimensional matrix, so that each row of the two-dimensional matrix is associated with a name of one solder ball of the n solder balls.

In an embodiment, the execution module 301 may randomly assign the names of the m pins to the m columns of the two-dimensional matrix, so that each column of the two-dimensional matrix is associated with a name of one pin of the m pins.

Figure 4:
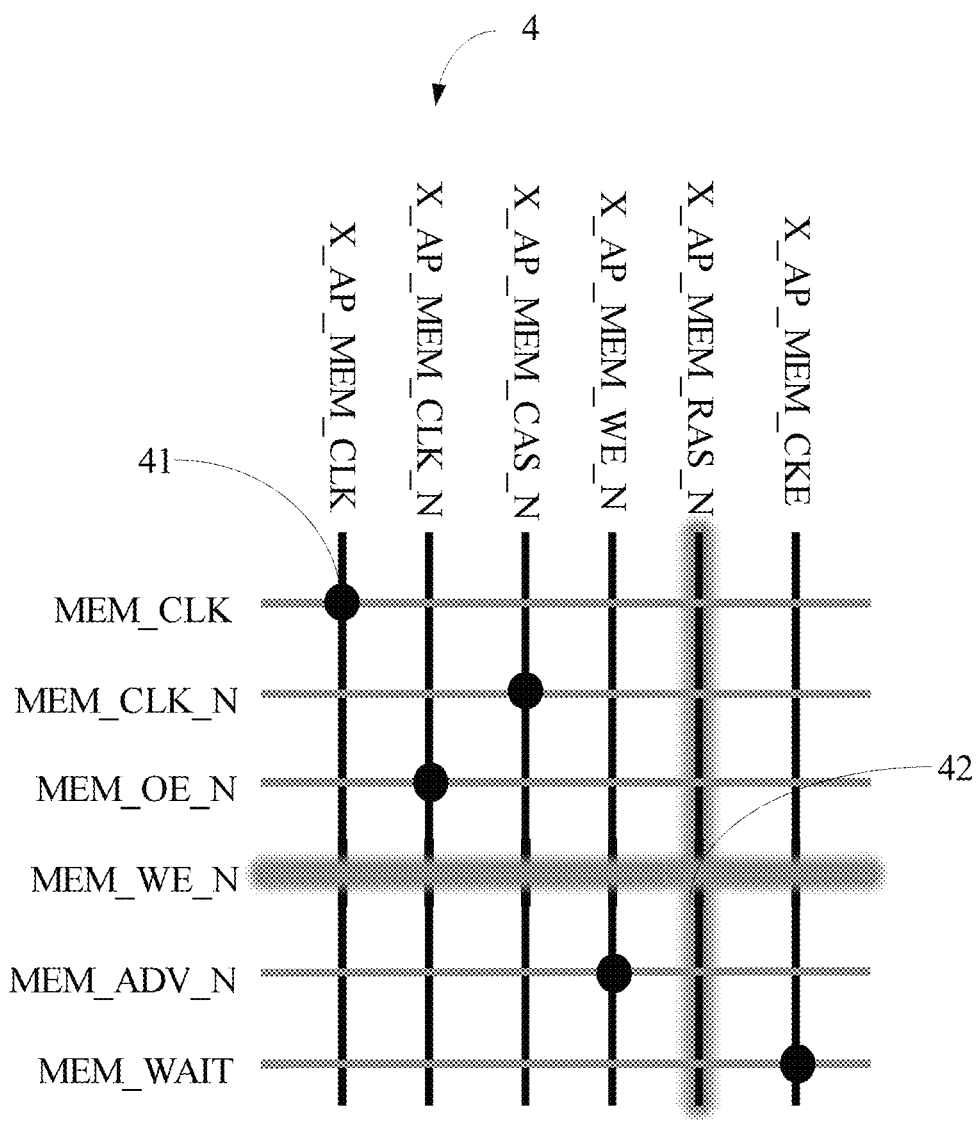
FIG. 4 shows an example of a two-dimensional matrix.

For example, referring to FIG. 4, the execution module 301 generates a two-dimensional matrix 4 with six rows and six columns. Each row of the two-dimensional matrix 4 corresponds to a name of one solder ball, and each column corresponds to a name of one pin. For example, the first row of the two-dimensional matrix 4 corresponds to the name of the solder ball "MEM_CLK", and the first column of the two-dimensional matrix 4 corresponds to the name of the pin "X_AP_MEM_CLK".

In other embodiments, when the execution module 301 generates multiple two-dimensional matrices, each row of each two-dimensional matrix of the multiple two-dimensional matrices has the same name of the solder ball, and the name of the pin corresponding to each column of the each two-dimensional matrix is determined according to the names of the pins of the chip corresponding to the each two-dimensional matrix.

In other embodiments, when the execution module 301 generates multiple two-dimensional matrices, the execution module 301 also sets a voltage value of the pin represented by each column of each two-dimensional matrix. It should be noted that the voltage value of the pin represented by each column can be obtained from the IBIS model, which records the voltage value of each pin of the chip.

Figure 5A:
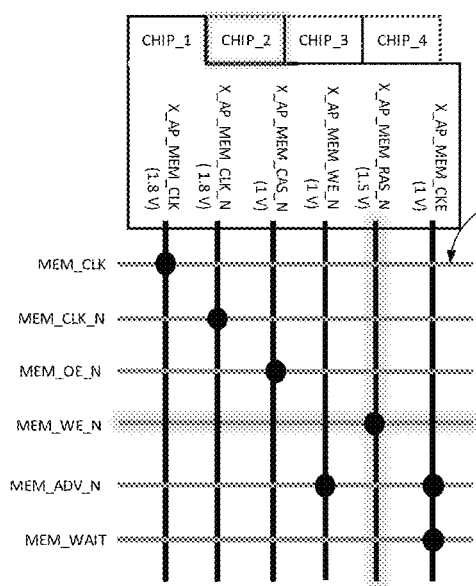
FIG. 5A and FIG. 5B shows an example of multiple two-dimensional matrices.
Figure 5B:
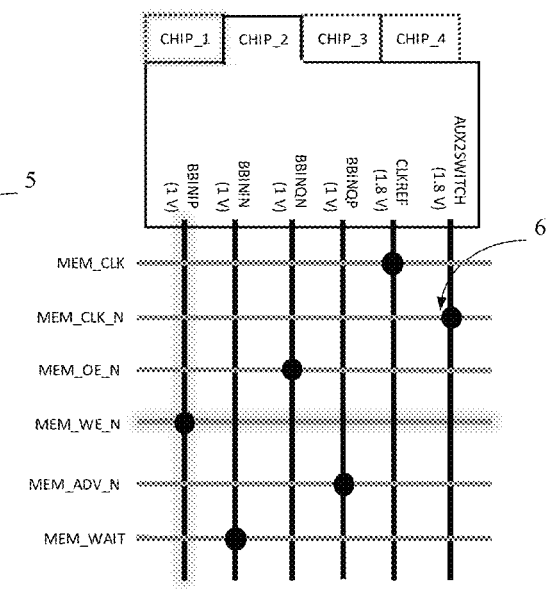

For example, referring to FIG. 5A and FIG. 5B, the name of the solder ball corresponding to each row of the two-dimensional matrix 5 generated by the execution module 301 is the same as the name of the solder ball corresponding to each row of the two-dimensional matrix 6. The name of the pin corresponding to each column of the two-dimensional matrix 5 corresponds to the name of the pin of the chip CHIP_1 that is corresponding to the two-dimensional matrix 5. The name of the pin corresponding to each column of the two-dimensional matrix 6 corresponds to the name of the pin of the chip CHIP_2 that is corresponding to the two-dimensional matrix 6. In addition, the execution module 301 also sets the voltage value of the pin represented by each column of the two-dimensional matrix and sets the voltage value of the pin represented by each column of the two-dimensional matrix 6. For example, referring to FIG. 5A and FIG. 5B, the execution module 301 sets the voltage value of the pin represented by the first column of the two-dimensional matrix 5 to be 1.8V, and sets the voltage value of the pin represented by the first column of the two-dimensional matrix 6 to be 1V.

At block S3, the detection module 302 detects an input signal and an input position of the input signal from the two-dimensional matrix.

At block S4, the execution module 301 performs display at the input position on the two-dimensional matrix according to a type of the input signal and the input position of the input signal.

In an embodiment, the type of the input signal includes, but is not limited to, a hover signal, and a click signal.

In one embodiment, when the input signal is the hover signal, the performing the display at the input position on the two-dimensional matrix according to the type of the input signal and the input position of the input signal includes (a1)-(a3):

(a1) When the input position of the hover signal is located on any row of the two-dimensional matrix, displaying the name of the solder ball corresponding to the any row at the input position.

In an embodiment, the execution module 301 further marks the any row of the two-dimensional matrix. For example, the execution module 301 can marks the any row of the two-dimensional matrix by enhancing the brightness of the any row such as performing a halo effect on the any row.

(a2) When the input position of the hover signal is located on any column of the two-dimensional matrix, displaying the name of the pin corresponding to the any column at the input position of the hover signal.

In an embodiment, the execution module 301 further marks the any column. For example, the execution module 301 can mark the any column by enhancing the brightness of the any column such as performing a halo effect on the any column.

(a3) When the input position of the hover signal is located at an intersection between any row and any column of the two-dimensional matrix, displaying the name of the solder ball corresponding to the any row and the name of the pin corresponding to the any column at the input position.

In an embodiment, the execution module 301 further marks the any row and the any column.

For example, referring to FIG. 4, when the input position of the hover signal is located at an intersection position 42 of the two-dimensional matrix, the execution module 301 can enhance the brightness of the row and the column corresponding to the intersection position 42.

In one embodiment, when the input signal is a click signal, the performing the display at the input position on the two-dimensional matrix according to the type of the input signal and the input position of the input signal further includes:

When the input position of the click signal is located at the intersection between any row and any column of the two-dimensional matrix, displaying a preset icon at the input position of the click signal. The preset icon is used to indicate that the solder ball represented by the any row and the pin represented by the any row are in a connected state.

For example, referring to FIG. 4, an icon 41 in the two-dimensional matrix 4 represents that the solder ball "MEM_CLK" and the pin "X_AP_MEM_CLK" are in the connected state. The solder ball "MEM_CLK" is represented by the row where the icon 41 is located and the pin "X_AP_MEM_CLK" is represented by the column where the icon 41 is located.

In an embodiment, the execution module 301 can further search the name of the solder ball represented by each of the n rows of the two-dimensional matrix and the name of the pin represented by each of the m columns of the two-dimensional matrix according to preset keywords; when the name of the solder ball represented by any row in the n rows matches the preset keyword, reducing a brightness of each of other rows of the n rows except the any row (for example, reducing the brightness of each of the other rows by displaying each of the other rows in gray); and when the name of the pin represented by any column of the m columns matches the preset keyword, decreasing a brightness of each of other columns of the m columns except the any column (for example, decreasing the brightness of each of the other columns by displaying each of the other columns in gray).

In an embodiment, the name of the solder ball represented by the any row of the n rows matching the preset keyword represents that the name of the solder ball represented by the any row of the n rows includes the preset keywords. If the name of the pin represented by the any column of the m columns matches the preset keyword, it means that the name of the pin represented by the any column of the m columns includes the preset keyword.

In an embodiment, the execution module 301 can provide an input interface for a user to input the keyword. The execution module 301 can display the input interface in response to a user input. For example, the execution module 301 can display the input interface when the user clicks a preset button.

Figure 6:
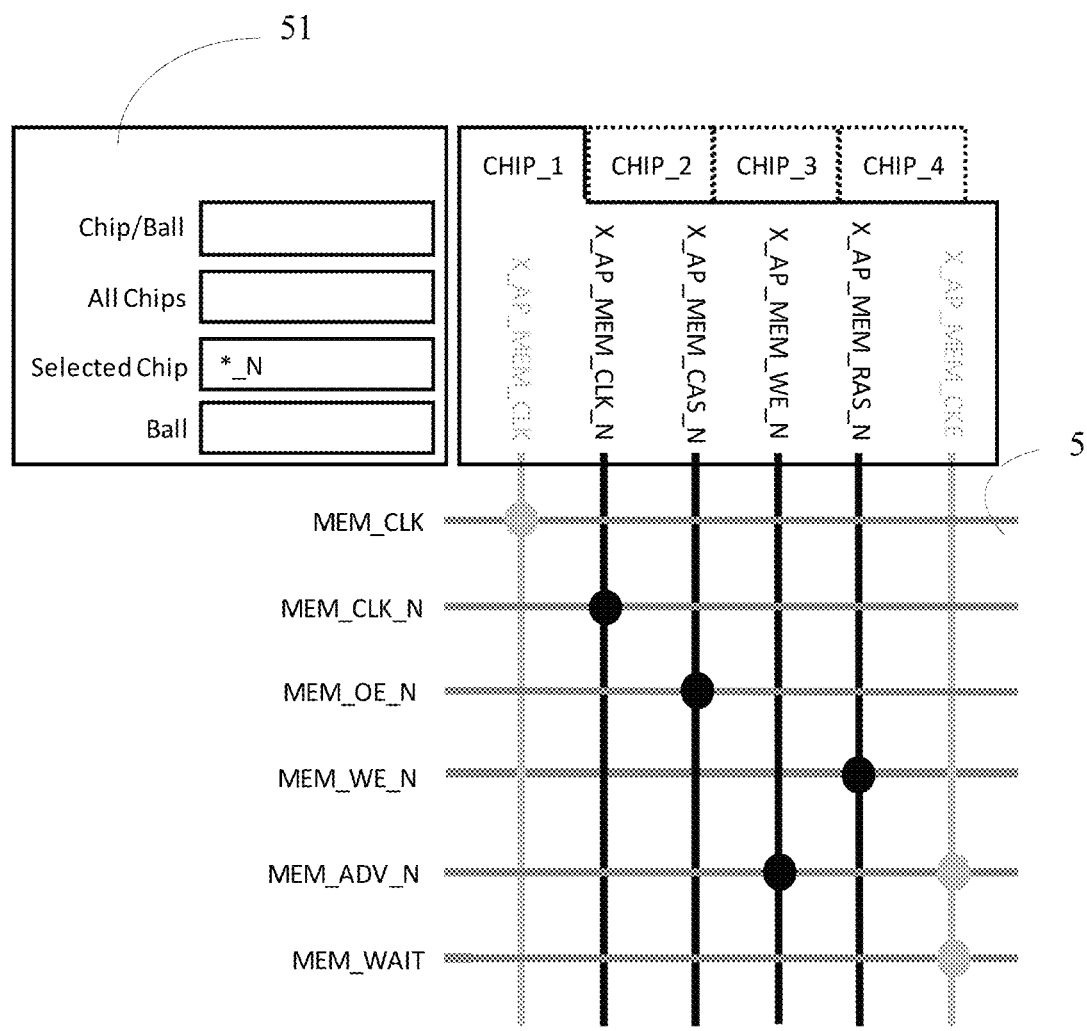
FIG. 6 illustrates an input interface for inputting keywords.

For example, referring to FIG. 6, the execution module 301 provides an input interface 51 for the user to input keywords.

On the input interface 51, when a keyword is entered in a field corresponding to "Chip/Ball", the execution module 301 searches for the name of the pin including the entered keyword from the names of the pins represented by the m columns of the two-dimensional matrix displayed on each page, and searches for the name of the solder ball including the entered keyword name from the names of the solder balls represented by the n rows of the two-dimensional matrix displayed on each page.

When a keyword is entered in a field corresponding to "All Chips", the execution module 301 searches for the name of the pin including the entered keyword from the names of the pins represented by the m columns of the two-dimensional matrix displayed on each page.

When a keyword is entered in a field corresponding to "Selected Chip", the execution module 301 searches for the name of the pin including the entered keyword from the names of the pins represented by the m columns of the two-dimensional matrix displayed on a current page.

When a keyword is entered in a field corresponding to "Ball", the execution module 301 searches for the name of the solder ball including the entered keyword from the names of the solder balls represented by the n rows of the two-dimensional matrix displayed on the current page.

In one embodiment, the execution module 301 can also detect whether a pin of the chip and a solder ball is properly connected according to the preset icon included in the two-dimensional matrix; and issue a corresponding prompt when the pin and the solder ball is wrongly connected.

In one embodiment, the detecting whether a pin of the chip and a solder ball is properly connected according to the preset icon included in the two-dimensional matrix; and issue a corresponding prompt when the pin and the solder ball is wrongly connected includes:

Detecting whether each row in the two-dimensional matrix includes the preset icon; and detecting whether each column in the two-dimensional matrix includes the preset icon; marking any row not including the preset icon to achieve a purpose of prompting; and marking any column not including the preset icon to achieve a purpose of prompting.

It should be noted that since each solder ball must be connected to at least one pin, and each pin must be connected to at least one solder ball, when there is any row that does not include the preset icon, it means the solder ball corresponding to the any row is not connected to any pin. When there is any column that does not include the preset icon, it means that the pin corresponding to the any column is not connected to any solder ball.

In an embodiment, the marking of the any row may refer to enhancing the brightness of the any row, such as performing the halo effect on the any row. The marking of the any column may refer to enhancing the brightness of the any column, such as performing the halo effect on the any column.

In an embodiment, the detecting whether a pin of the chip and a solder ball is properly connected according to the preset icon included in the two-dimensional matrix; and issue a corresponding prompt when the pin and the solder ball is wrongly connected further includes:

Acquiring the name of the solder ball and the name of the pin corresponding to each of the preset icons in the two-dimensional matrix; determining whether the name of the solder ball corresponding to any one of the preset icons is consistent with a name of a preset solder ball, and determining whether the name of the pin corresponding to the any one of the preset icons is consistent with a name of a preset pin; determining that the solder ball corresponding to the any one of the preset icons is correctly connected to the pin corresponding to the any one of the preset icons when the name of the solder ball corresponding to the any one of the preset icons is the same as the name of the preset solder ball are consistent, and the name of the pin corresponding to the any one of the preset icons is consistent with the name of the preset pin; determining that the solder ball corresponding to the any one of the preset icons is incorrectly connected to the pin corresponding to the any one of the preset icons when the name of the solder ball corresponding to the any one of the preset icons is inconsistent with the name of the preset solder ball, and/or the name of the pin corresponding to the any one of the preset icons is inconsistent with the name of the preset pin; and marking the row and the column corresponding to the any one of the preset icons, so as to achieve the purpose of prompting when it is determined that the solder ball corresponding to the any one of the preset icons is incorrectly connected to the pin corresponding to the any one of the preset icons.

In one embodiment, the marking the row and the column corresponding to the any one of the preset icons can be performed by enhancing the brightness of the row and the column corresponding to the any one of the preset icons.

It should be noted that the solder ball corresponding to any one of the preset icons is referred to the solder ball represented by the row corresponding to the any one of the preset icons, and the pin corresponding to the any one of the preset icons is referred to the pin represented by the column corresponding to any one of the preset icons.

In an embodiment, to detect whether there is a short-circuit connection between a positive electrode of a power supply (VDD) and a negative electrode of the power supply (GND), the detecting whether a pin of the chip and a solder ball is properly connected according to the preset icon included in the two-dimensional matrix; and issue a corresponding prompt when the pin and the solder ball is wrongly connected further includes:

Determining whether there is a target icon included in all of the preset icons in the two-dimensional matrix, wherein a solder ball that is represented by a row corresponding to the target icon is representing a positive electrode of a power supply (VDD), and a pin that is represented by a column corresponding to the target icon is representing a negative electrode of the power supply (GND);

Marking the row and column corresponding to the target icon to achieve the purpose of prompting when the target icon is included in the two-dimensional matrix.

Figure 7:
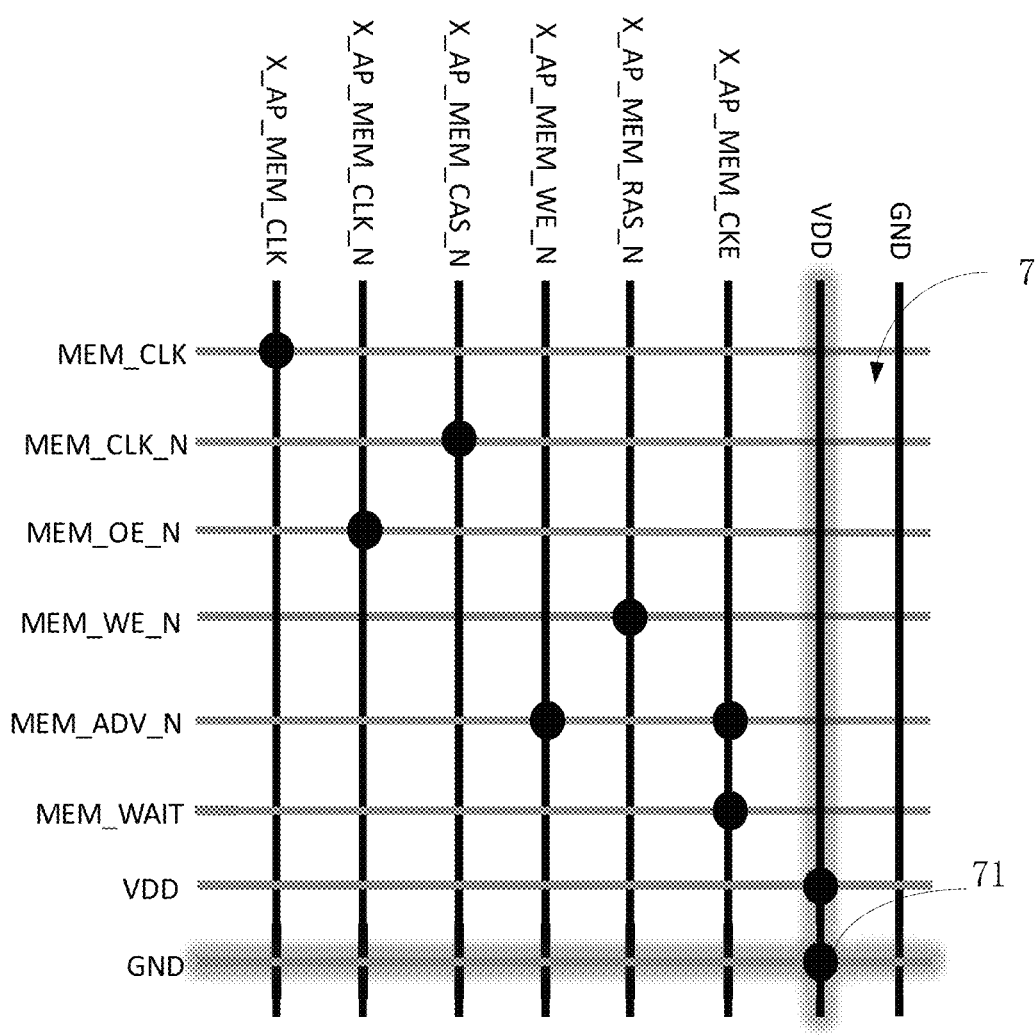
FIG. 7 illustrates a target icon.

For example, a preset icon 71 of the two-dimensional matrix 7 shown in FIG. 7 is the target icon.

In an embodiment, the execution module 301 can further export related information of the chip from the two-dimensional matrix, for example, export the related information of the chip to a designated file such as an excel file. The related information includes, but is not limited to, the name of the solder ball connected to each pin, a total number of solder balls connected to each pin, a name of the pin connected to each solder ball, a total number of pins connected to each solder ball, etc.

It should be noted that the execution module 301 can export the related information of the chip according to requirements of a manufacturer of manufacturing packaged chips.

It should be noted that the chip pin connection status display method provided by the present disclosure can be applied to packaging fields such as 2.5D/3D IC, fan out wafer level package, and system in package.

The above description is only embodiments of the present disclosure, and is not intended to limit the present disclosure, and various modifications and changes can be made to the present disclosure. Any modifications, equivalent substitutions, improvements, etc. made within the spirit and scope of the present disclosure are intended to be included within the scope of the present disclosure.

What is claimed is:

1. A chip pin connection status display method applied to a computer device, the method comprising:
    generating a two-dimensional matrix with n rows and m columns according to a total number n of solder balls and a total number in of pins of a chip, wherein each of the n rows of the two-dimensional matrix represents one of the n solder balls, and each of the in columns of the two-dimensional matrix represents one of the m pins;
    detecting an input signal and an input position of the input signal from the two-dimensional matrix; and
    performing display at the input position on the two-dimensional matrix according to a type of the input signal and the input position of the input signal.

2. The chip pin connection status display method according to claim 1, wherein after the generating of the two-dimensional matrix, the method further comprises:
    associating each row of the n rows of the two-dimensional matrix with a name of the solder ball represented by the each row; and
    associating each column of the m columns of the two-dimensional matrix with a name of the pin represented by the each column.

3. The chip pin connection status display method according to claim 2, wherein the type of the input signal comprises a hover signal, and a click signal.

4. The chip pin connection status display method according to claim 3, further comprising:
    displaying, when the input signal is hover signal and the input position of the hover signal is located on any row of the two-dimensional matrix, the name of the solder ball corresponding to the any row at the input position;
    displaying, when the input signal is hover signal and the input position of the hover signal is located on any column of the two-dimensional matrix, the name of the pin corresponding to the any column at the input position; and
    displaying, when the input signal is hover signal and the input position of the hover signal is located at an intersection between any row and any column of the two-dimensional matrix, the name of the solder ball corresponding to the any row and the name of the pin corresponding to the any column at the input position.

5. The chip pin connection status display method according to claim 4, further comprising:
    marking the any row at the input position, when the input signal is hover signal and the input position of the hover signal is located on the any row of the two-dimensional matrix;
    marking the any column at the input position, when the input signal is hover signal and the input position of the hover signal is located on the any column of the two-dimensional matrix; and
    marking the any row and the any column at the input position, when the input signal is hover signal and the input position of the hover signal is located at the intersection between the any row and the any column.

6. The chip pin connection status display method according to claim 3, further comprising:
    displaying a preset icon at the input position of the input signal, when the input signal is the click signal and the input position of the click signal is located at an intersection between any row and any column of the two-dimensional matrix, wherein the preset icon is used to indicate that the solder ball represented by the any row and the pin represented by the any row are in a connected state.

7. The chip pin connection status display method according to claim 6, further comprising:
    detecting whether a pin of the chip and a solder ball is properly connected according to a preset icon comprised in the two-dimensional matrix; and
    issuing a corresponding prompt when the pin and the solder ball is wrongly connected.

8. The chip pin connection status display method according to claim 2, further comprising:
    searching the name of the solder ball represented by each of the n rows of the two-dimensional matrix and the name of the pin represented by each of the in columns of the two-dimensional matrix according to preset keywords;
    reducing, when the name of the solder ball represented by any row in the n rows matches the preset keyword, a brightness of each of other rows of the n rows except the any row; and
    decreasing, when the name of the pin represented by any column of the m columns matches the preset keyword, a brightness of each of other columns of the m columns except the any column.

9. A computer device comprising:
    a storage device;
    at least one processor; and
    the storage device storing one or more programs, which when executed by the at least one processor, cause the at least one processor to:
    generate a two-dimensional matrix with n rows and in columns according to a total number n of solder balls and a total number m of pins of a chip, wherein each of the n rows of the two-dimensional matrix represents one of the n solder balls, and each of the m columns of the two-dimensional matrix represents one of the m pins;
    detect an input signal and an input position of the input signal from the two-dimensional matrix; and
    perform display at the input position on the two-dimensional matrix according to a type of the input signal and the input position of the input signal.

10. The computer device according to claim 9, wherein after the generating of the two-dimensional matrix, the at least one processor is further caused to:
    associate each row of the n rows of the two-dimensional matrix with a name of the solder ball represented by the each row; and
    associate each column of the m columns of the two-dimensional matrix with a name of the pin represented by the each column.

11. The computer device according to claim 9, wherein the type of the input signal comprises a hover signal, and a click signal.

12. The computer device according to claim 11, wherein the at least one processor is further caused to:

display, when the input signal is hover signal and the input position of the hover signal is located on any row of the two-dimensional matrix, the name of the solder ball corresponding to the any row at the input position;

display, when the input signal is hover signal and the input position of the hover signal is located on any column of the two-dimensional matrix, the name of the pin corresponding to the any column at the input position; and display, when the input signal is hover signal and the input position of the hover signal is located at an intersection between any row and any column of the two-dimensional matrix, the name of the solder ball corresponding to the any row and the name of the pin corresponding to the any column at the input position.

13. The computer device according to claim 12, wherein the at least one processor is further caused to:

mark the any row at the input position, when the input signal is hover signal and the input position of the hover signal is located on the any row of the two-dimensional matrix;

mark the any column at the input position, when the input signal is hover signal and the input position of the hover signal is located on the any column of the two-dimensional matrix; and mark the any row and the any column at the input position, when the input signal is hover signal and the input position of the hover signal is located at the intersection between the any row and the any column.

14. The computer device according to claim 11, wherein the at least one processor is further caused to:

display a preset icon at the input position of the input signal, when the input signal is the click signal and the input position of the click signal is located at an intersection between any row and any column of the two-dimensional matrix, wherein the preset icon is used to indicate that the solder ball represented by the any row and the pin represented by the any row are in a connected state.

15. The computer device according to claim 14, wherein the at least one processor is further caused to:

detect whether a pin of the chip and a solder ball is properly connected according to a preset icon comprised in the two-dimensional matrix; and issue a corresponding prompt when the pin and the solder ball is wrongly connected.

16. The computer device according to claim 10, wherein the at least one processor is further caused to:

search the name of the solder ball represented by each of the n rows of the two-dimensional matrix and the name of the pin represented by each of the m columns of the two-dimensional matrix according to preset keywords;

reduce, when the name of the solder ball represented by any row in the n rows matches the preset keyword, a brightness of each of other rows of the n rows except the any row; and decrease, when the name of the pin represented by any column of the m columns matches the preset keyword, a brightness of each of other columns of the m columns except the any column.

17. A non-transitory storage medium having instructions stored thereon, when the instructions are executed by a processor of a computer device, the processor is configured to perform a chip pin connection status display method, wherein the method comprises:

generating a two-dimensional matrix with n rows and m columns according to a total number n of solder balls and a total number m of pins of a chip, wherein each of the n rows of the two-dimensional matrix represents one of the n solder balls, and each of the m columns of the two-dimensional matrix represents one of the m pins;

detecting an input signal and an input position of the input signal from the two-dimensional matrix; and performing display at the input position on the two-dimensional matrix according to a type of the input signal and the input position of the input signal.

18. The non-transitory storage medium according to claim 17, wherein after the generating of the two-dimensional matrix, the method further comprises:

associating each row of the n rows of the two-dimensional matrix with a name of the solder ball represented by the each row; and associating each column of the m columns of the two-dimensional matrix with a name of the pin represented by the each column.

19. The non-transitory storage medium according to claim 18, wherein the type of the input signal comprises a hover signal, and a click signal.

20. The non-transitory storage medium according to claim 19, wherein the method further comprises:

displaying, when the input signal is hover signal and the input position of the hover signal is located on any row of the two-dimensional matrix, the name of the solder ball corresponding to the any row at the input position;

displaying, when the input signal is hover signal and the input position of the hover signal is located on any column of the two-dimensional matrix, the name of the pin corresponding to the any column at the input position; and displaying, when the input signal is hover signal and the input position of the hover signal is located at an intersection between any row and any column of the two-dimensional matrix, the name of the solder ball corresponding to the any row and the name of the pin corresponding to the any column at the input position.

* * * * *